(12) United States Patent
Favre et al.

(10) Patent No.: US 8,356,526 B2
(45) Date of Patent: Jan. 22, 2013

(54) CONTAMINATION MEASUREMENT STATION AND METHOD FOR A SEMICONDUCTOR SUBSTRATES TRANSPORT POD

(75) Inventors: Arnaud Favre, Annecy (FR); Erwan Godot, Annecy (FR); Bertrand Bellet, Chambery (FR)

(73) Assignee: Alcatel Lucent, Paris (FR)

( * ) Notice: Subject to any disclaimer, the term of this patent is extended or adjusted under 35 U.S.C. 154(b) by 74 days.

(21) Appl. No.: 12/736,532

(22) PCT Filed: Apr. 16, 2009

(86) PCT No.: PCT/FR2009/050713
§ 371 (c)(1),
(2), (4) Date: Nov. 8, 2010

(87) PCT Pub. No.: WO2009/138637
PCT Pub. Date: Nov. 19, 2009

(65) Prior Publication Data
US 2011/0048143 A1 Mar. 3, 2011

(30) Foreign Application Priority Data
Apr. 24, 2008 (FR) .................................... 08 02284

(51) Int. Cl.
*G01N 1/00* (2006.01)

(52) U.S. Cl. .................................................. 73/864.33

(58) Field of Classification Search .................. None
See application file for complete search history.

(56) References Cited

U.S. PATENT DOCUMENTS

| | | | |
|---|---|---|---|
| 5,939,647 A * | 8/1999 | Chinn et al. ............... 73/864.71 |
| 6,408,701 B1 * | 6/2002 | Fujita ......................... 73/864.71 |
| 6,848,325 B2 * | 2/2005 | Parmeter et al. ........... 73/864.33 |
| 6,852,539 B2 * | 2/2005 | Cordery et al. .................... 436/1 |
| 6,923,188 B2 * | 8/2005 | Wen et al. ................... 134/22.18 |
| 6,948,653 B2 * | 9/2005 | Beckert et al. .................. 232/45 |
| 7,487,689 B2 * | 2/2009 | Ornath et al. .............. 73/864.33 |

\* cited by examiner

*Primary Examiner* — Robert R Raevis
(74) *Attorney, Agent, or Firm* — Carmen Patti Law Group, LLC

(57) ABSTRACT

The invention concerns a measurement station for the measurement of particle contamination of a transport pod for the conveyance and atmospheric storage of semiconductor substrates, such pod comprising a casing capable of being closed by means of a removable access door, such station comprising:
an interface (5) capable of coupling to a casing of a transport pod (3) instead of the said door, the interface (5) comprising at least one injection nozzle (9) arranged at one mobile end of a pipe protruding from the said interface to direct a jet of gas in a perpendicular direction towards a portion of the wall (13) on the inside (10) of the said casing coupled to the said measurement station, so as to detach particles (11) from the said casing (3) by the impact of the gas jet on the said wall (13), and
a measurement device (7) comprising a vacuum pump (17), a particle counter (19), and a measurement conduit (21) of which an inlet (23) leads to the inside (10) of the said casing (3), and of which an outlet (25) is coupled to the vacuum pump (17), the measurement conduit (21) being furthermore connected to the particle counter (19), to connect the inside (10) of the casing of the transport pod (3) coupled to the said measurement station with the particle counter (19).
The invention also concerns a method for the measurement of particle contamination of a transport pod for the conveyance and atmospheric storage of semiconductor substrates.

8 Claims, 3 Drawing Sheets

Figure 1:
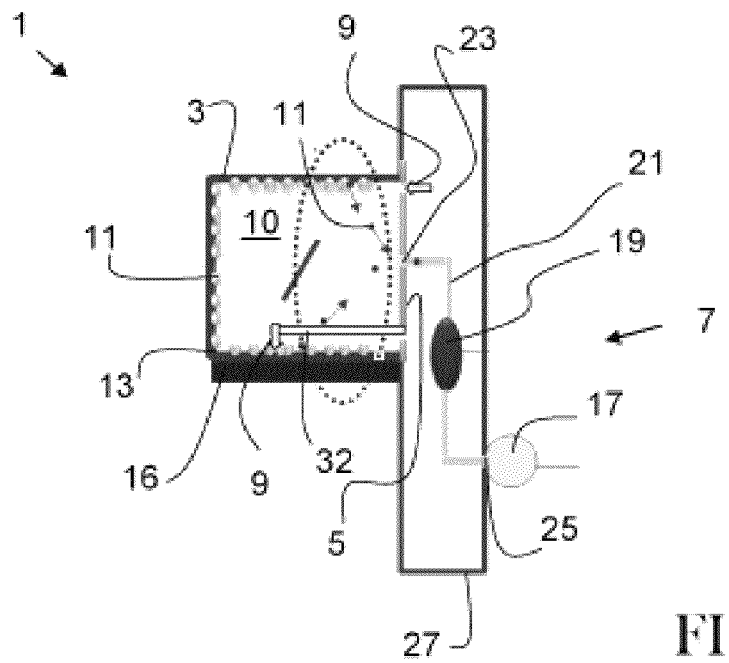

CONTAMINATION MEASUREMENT STATION AND METHOD FOR A SEMICONDUCTOR SUBSTRATES TRANSPORT POD

The present invention pertains to a particle contamination measurement station for a transport pod for the conveyance and atmospheric storage of semiconductor substrates such as semiconductor wafers or reticles. The invention also pertains to a corresponding measurement method.

Transport and storage pods establish a confined space under atmospheric pressure, separate from the substrate transport and usage environment, for the transport and storage of one or more substrates.

In the semiconductor manufacturing industry, these pods are used to transport the substrates from one device to another, or to store them between two manufacturing stages.

A distinction is made in particular between standardized opening FOUP (Front Opening Unified Pod) or FOSB (Front Opening Shipping Box) or bottom opening SMIF (Standard Mechanical Interface Pod) type wafer transport and storage pods and standard RSP (Reticle SMIF Pods) or MRP (Multiple Reticle SMIF Pod) type pods for the transport and storage of reticles.

These transport pods are made of materials such as polycarbonate, which may in certain cases concentrate contaminants and in particular organic, amine, or acid contaminants.

In fact, during the manufacturing of the semiconductors, the transport pods are handled, which leads to the formation of pollutant particles which become lodged in the walls of the transport pods, thus contaminating them.

The particles adhering to the walls of the transport pods can then come loose, falling on the substrates stored in these pods and damaging them.

Such contamination can be highly damaging for the substrates. It is therefore necessary to clean the pods regularly so as to be able quickly to take the necessary decontamination measures.

Regular cleaning of these pods by washing them with a liquid such as pure water is therefore planned. Such cleaning stages are carried out either directly in the semiconductor substrate manufacturing plants or at companies specialized in the cleaning of atmospheric transport pods.

To determine when a pod needs cleaning, a particle contamination measurement method is known that consists in measuring the number of particles deposited on the walls of the transport pods by means of a liquid particle detector. However, this method has the disadvantage of being long and cumbersome to implement in an industrial semiconductor manufacturing process.

Furthermore, this type of method is not reproducible. Indeed, the measurement obtained is directly linked to the specialized company instructed to implement it, which does not allow for the implementation of standardized checks.

Manufacturers therefore prefer to send transport pods for cleaning regularly.

Consequently, some transport pods without particles are nonetheless cleaned, thus uselessly reducing production rates, while others, which are particle polluted, continue to store and/or transport semiconductor substrates with the potential risk of substrate contamination.

Manufacturers therefore plan on frequent preventive cleanings so as not to increase the defectiveness level of the substrates.

The goal of the present invention is therefore to propose a measurement station and matching method enabling measurement of the level of particle contamination of transport pods for the conveyance and atmospheric storage of semiconductor substrates by means of a real time measurement capable of being implemented in an industrial manufacturing chain process directly at the manufacturing plant.

To that effect, the invention concerns a measurement station for the measurement of particle contamination of a transport pod for the conveyance and atmospheric storage of semiconductor substrates, such pod comprising a casing capable of being closed by means of a removable access door, such station comprising:

an interface capable of coupling to the said transport pod casing instead of the said door, the interface comprising at least one injection nozzle arranged at one mobile end of a pipe protruding from the said interface to direct a jet of gas in a perpendicular direction towards a portion of the wall on the inside of the said casing coupled to the said measurement station, so as to detach particles from the said casing by the impact of the gas jet on the said wall, and a measurement device comprising a vacuum pump, a particle counter and a measurement conduit, of which an inlet leads to the inside of the said casing and of which an outlet is connected to the vacuum pump, the measurement conduit being furthermore connected to the particle counter, to create a communication between the inside of the casing of the transport pod coupled to the said measurement station and the particle counter.

According to other characteristics of the measurement station, taken singly or in combination, the said interface is equipped with a plurality of spacers enabling the said interface to couple with the said casing while leaving interstitial gaps for the passage of a leak flow between the inside of the said casing and the external environment, the said spacers have the shape of studs, the measurement station comprises an atmospheric chamber of the clean room type, certified ISO 3, surrounding the said interface, the injection nozzle is configured to inject a pulsed gas jet, the interface comprises a plurality of injection nozzles equipped with particle filters, the measurement station comprises stoppers intended to plug the filtered gas passages of the transport pod casing, the measurement station comprises a processing unit to generate a signal that is representative of a state of cleanliness of the casing of the said pod.

The invention also concerns a method for the measurement of particle contamination of a transport pod for the conveyance and atmospheric storage of semiconductor substrates, comprising:

a first stage at which a jet of gas is perpendicularly directed towards a portion of wall inside a casing of a pod coupled to the said particle contamination measurement station, as previously defined, so as to detach such particles from the casing by means of the impact of the gas jet onto the said wall, and in which the vacuum pump is operated so as to produce a gas outflow from the inside of the transport pod casing coupled to the said measurement station towards the particle counter, and a second stage, at which a number of particles is measured with the particle counter and the result of the measurement is compared to a predefined threshold to determine whether a liquid cleansing stage is necessary based on the result of the comparison.

According to one or more characteristics of the measurement method, taken singly or in combination, a gas jet is injected in a discontinuous fashion over the first stage of the said measurement method, over the course of the said first stage the said gas jet is injected against the wall, then in the course of the said second stage, the injection is stopped to measure the number of particles and the injection nozzle is displaced perpendicularly to a new wall area, and the said first and second stages are repeated to determine whether a liquid cleansing stage is necessary as a function of the result of the comparisons, the injection flow is greater than the pumping flow.

Figure 2:
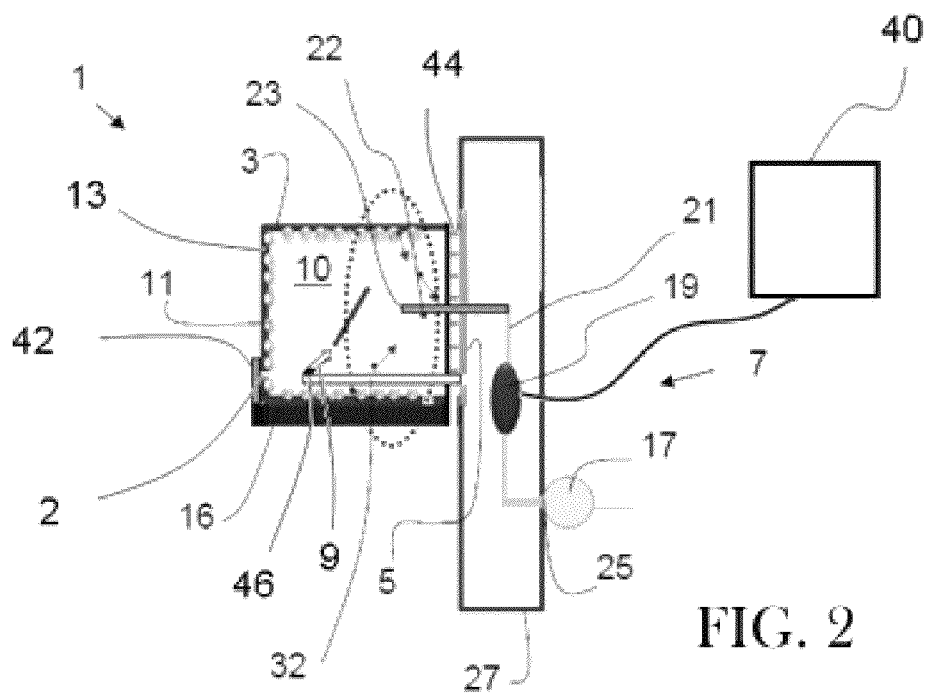
Figure 3:
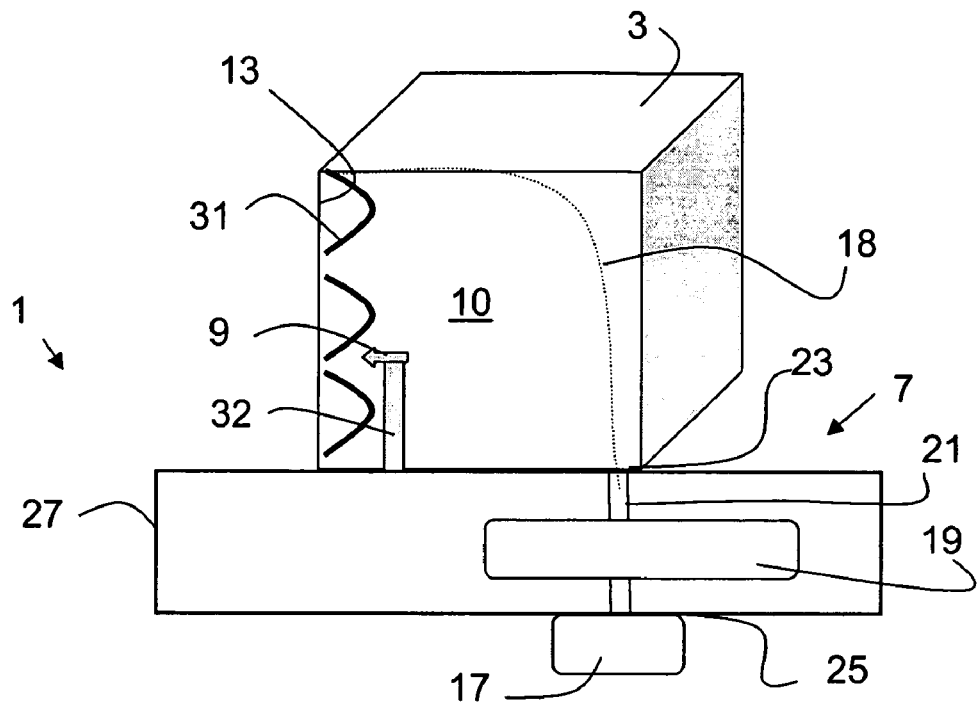
Figure 4:
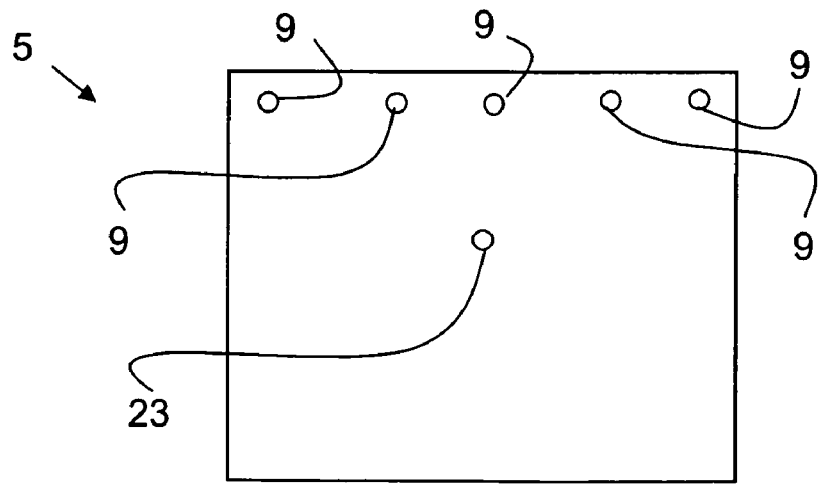
Figure 5:
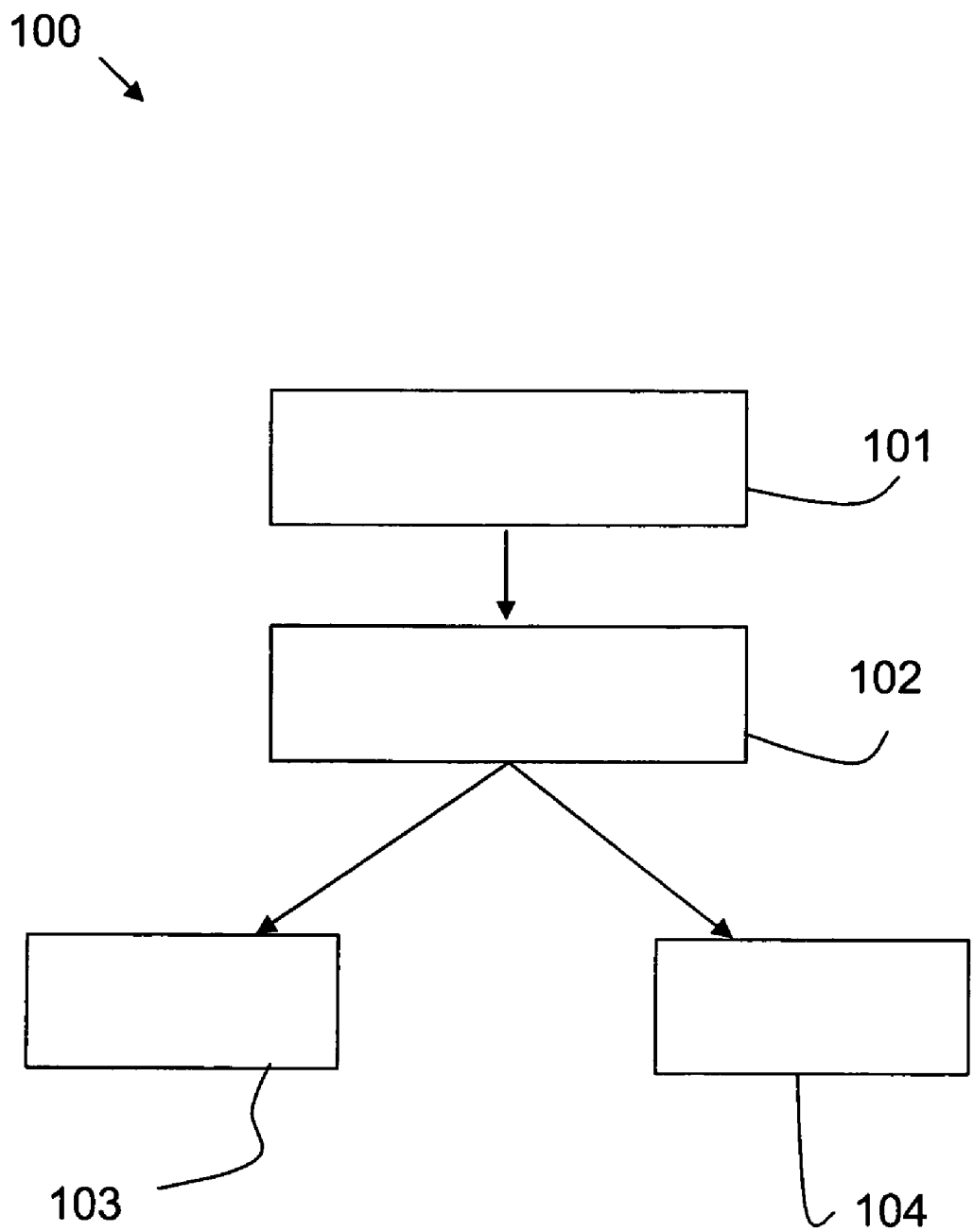

Other advantages and characteristics shall become apparent upon reading the description of the invention, as well as the attached drawings, in which:

FIG. 1 is a schematic view of a measurement station in a position coupled to an envelope of a transport pod, FIG. 2 represents a variant of the measurement station of FIG. 1, FIGS. 3 and 4 are schematic views of components of a measurement station coupled to a pod casing, seen in operation, FIG. 5 is an organizational diagram of a measurement method.

For reasons of clarity, the stages of the measurement method are numbered starting from 100.

The invention concerns a measurement station for particle contamination of the casing of a transport pod for the conveyance and atmospheric storage of semiconductor substrates.

The measurement station is capable of coupling, in particular, with at least one standardized transport casing of the SMIF, FOUP, FOSB, RSP or MRP type.

Such transport and/or storage pods and their interior atmosphere are at atmospheric air or nitrogen pressure. The atmospheric pressure is the pressure of the transport pods in their usage environment, such as the atmospheric pressure of the clean room.

The transport pods comprise a peripheral casing capable of being closed by a removable access gate dimensioned for the introduction and extraction of substrates.

Inside the casing, the transport pods are equipped with a substrate support for the maintenance and support of one or more substrates.

The pod is rather leakproof, but the level of tightness is such that slight leaks can take place through the gasket located between the casing and the gate.

Some transport pods, in particular those of FOUP type, comprise filtered gas passages 2 (FIG. 2) to balance the transport pod's internal and external pressure.

FIG. 1 represents a measurement station coupled to a casing of a FOUP type transport pod 3 for the conveyance and atmospheric storage of semiconductor substrates.

The measurement station is for example placed in a clean room to constitute a control post.

The measurement station can equally be incorporated in a semiconductor manufacturing equipment. The manufacturing equipment would then preferably comprise three ISO 3 ISO 14644-1 clean room type chambers certified according to the standard defining the classification of air cleanliness of clean rooms and controlled environments in terms of the concentration of particles in suspension in the air.

A first chamber is intended for removal of the access gate to a transport pod, the second chamber constitutes the measurement station to measure the particle contamination of the casing 3, and a third chamber is for example a cleaning unit enabling implementation of a liquid cleansing process.

The second chamber is in communication with the first and the third chamber so as to be able to transfer the casing of the transport pod 3 from one chamber to another.

The measurement station 1 comprises, on the one hand, an interface 5 capable of coupling with the casing of the transport pod 3, and on the other hand a measurement device 7.

The interface 5 presents the same dimensions as a transport pod gate and can thus be easily coupled to a casing of a transport pod 3 instead of the access gate.

Although represented vertically on FIG. 1, the interface 5 may equally be arranged in any position, in particular in a horizontal position.

The interface 5 further comprises at least one injection nozzle 9 to direct a gas jet in a direction perpendicular to a portion of wall 13 inside 10 the casing of the pod 3 coupled to the measurement station 1, so as to detach particles 11 from the envelope 3 by the impact of the gas jet on the wall 13.

The gas is a clean gas, e.g. air or nitrogen.

With the targeted injection of the gas jet, the gas flow presents a weak angular dispersion and for a few seconds generates an aerodynamic force that removes the particles adhering to the inside walls 13 of the casing 3.

To improve particle removal, a non-constant gas flow is injected, i.e. a pulsed gas jet, a mobile gas jet capable of sweeping a portion of wall 13, a gas jet successively injected through a plurality of injection nozzles 9, or indeed an amplitude modulated gas flow, such as a gas flow ramp.

Thus, the gas jet attacks the walls 13 in a discontinuous manner, increasing the number of gas acceleration phases, in the course of which the particles 11 are detached, promoting measurement of the pollution level and thus distinctly improving particle removal.

The measurement device 7 comprises a vacuum pump 17, a particle counter 19 and a measurement conduit 21, of which an inlet is capable of being connected to the inside 10 of the coupled casing 3 and of which an outlet 25 is connected to the vacuum pump 17.

Preferably, the inlet 23 will lead directly to a frontal face of the interface 5 (FIG. 1) or it may be arranged more on the inside 10 of the transport casing 3 by an extension 22 of the measurement conduit 21 beyond the interface 5 (FIG. 2).

The measurement conduit 21 is furthermore connected to the particle counter 19, to create a communication between the inside 10 of the casing of the transport pod 3 coupled to the measurement station 1 and the particle counter 19.

The particle counter 19 is of the aerosol type, i.e. that it enables provision of a quantitative information concerning the particles 11 in suspension in a gaseous environment. For example, the particle counter is based on laser technology.

Preferably, the pumping flow of the vacuum pump 17 is of the order of 1.7 $m^3$/h.

The entrainment of the gases produced by the nozzles 9 is added to that created by the vacuum pump 17, which enables amplification of the gas outflow comprising the detached particles 11, in the direction of the inlet 23.

An example of the trajectory 18 of the gas outflow has been represented in FIG. 3. The said gas outflow 18 caused by the pumping flow enables on the one hand collection of the detached particles 11 in suspension, and, on the other hand, directing them towards the inlet 23 of the measurement device 7.

Thus, a majority of detached particles 11 of the casing 3 is potentially detectable by the particle counter 19.

Furthermore, the measurement station 1 advantageously comprises a processing unit 40 to transmit to a cleaning unit a signal that is representative of a state of cleanliness of the casing of the said pod 3.

As can be seen in FIG. 2, the injection nozzle 9 is arranged at a mobile end of a protruding pipe 32 of the interface 5.

The extremity of the pipe 32 can moreover be oriented towards the inside 10 of the casing 3. Thus the gas jet is equally likely to reach a substrate support affixed to the inside of the casing of the transport pod 3.

Advantageously, the gas injection nozzle 9 is configured to inject a pulsed gas jet. The frequency and pulsation strength of the gas jet 9 is therefore regulated in association to a pumping rate of the vacuum pump 17 adapted in a manner such as to generate a gas outflow wave 31 in the casing 3 enabling optimization of the detachment of the particles 11.

The mobility in translation and/or rotation of the extremity of the pipe 32 enables adaptation of the etching rate of the gas jet on the inside walls 13 and, more particularly, adaptation of the perpendicular component of the speed of the gas jet, so as to optimize the impact causing the detachment of the particles 11.

The inlet 23 of the measurement conduit 21 is then advantageously arranged in an extension 22 of the measurement conduit 21, preferably equally mobile in translation and/or in rotation.

Thus, the inlet 23 may be placed at a constant distance and angle in regard to the injection nozzle 9, enabling obtention of a measurement independent of the orientation of the injection jet 9.

The measurement conduit 21 and the pipe 32 are advantageously arranged on one and the same mobile arm (not shown).

According to a second embodiment represented in FIG. 4, the interface 5 comprises a plurality of gas injection nozzles 9.

Discontinuous injection is then obtained by the successive injection of a gas jet into each of the injection nozzles 9.

Advantageously, the interface 5 comprises several gas injection nozzles 9 configured to inject a pulsed gas jet, Discontinuous injection is then obtained by the successive sweeping of the different injection nozzles 9 and/or by the pulsing of the gas jet.

Successive injection through the different injection nozzles 9 enables on the one hand to target the injection to certain dead zones of the casing 3 and, on the other hand, to attain a significant portion of the wall 13 by the sweeping of the gas jet.

Advantageously, the processing unit 40 can determine data concerning the contamination of the casing 3 relative to each injection nozzle 9. Thus, the processing unit 40 transmits a signal that is representative of the state of cleanliness associated to each portion of the casing 3 to be analyzed, enabling determination of the more or less dirty areas of the casing 3.

FIG. 4 represents an advantageous embodiment of the interface 5, wherein the interface 5 comprises a plurality of gas injection nozzles 9, namely five in this embodiment.

The nozzles 9 can be aligned in a peripheral strip of the frontal face of the interface 5, so as to direct a gas jet perpendicularly to a plane defined by the interface 5.

The dimensions and inclination of the injection nozzles 9 are adapted to generate a perpendicular gas jet in the direction of the inside walls 13 of the pod casing 3 enabling the detachment of the particles 11 adhered to the walls 13 to be caused, in particular in the areas signifying a state of pollution of the casing of the transport pod 3.

Thus, the size of the injection nozzles 9 is relatively small, for example the nozzles 9 comprise an orifice of the order of one millimeter in diameter so as to generate a high speed gas jet, while being simple to implement.

To force the gas jet towards the inside 10 of the casing 3, the measurement station 1 advantageously comprises stoppers 42 to plug the filtered gas passages 2 of the casing of the transport pod 3 (shown on FIG. 2).

The stoppers 42 can for example be carried on a platform 16 of the measurement station 1. The stoppers 42 also make it possible to ensure that no external particle can penetrate into the inside 10 of the casing of the transport pod 3.

Moreover, the coupling of the interface 5 with the transport casing 3 is implemented in a non-leakproof manner. For this purpose, the interface 5 is equipped with a plurality of spacers 44 enabling the interface 5 to couple with the casing 3 while leaving interstitial gaps for the passage of a leak flow between the inside 10 of the casing 3 and the external environment. The spacers 44 are for example in the form of studs regularly distributed over a peripheral strip of the frontal face of the interface 5.

Further provided for is a gas injection flow greater than the pumping flow, so that the inside 10 of the transport casing 3 is in slight overpressure as compared to the external environment, thus promoting the outflow of fluids towards the outside of the casing 3. The leak flow is then directed through the interstitial gaps towards the outside environment. This thus avoids particle contamination on the inside 10 of the casing 3.

Similarly, the injection nozzles 9 are advantageously equipped with particle filters 46 to filter any potential polluting particle originating from the external environment.

It can also be provided for the measurement station 1 to comprise an atmospheric chamber 27 of the clean room type, preferably certified ISO 3, in conformity with the ISO 14644-1 standard, surrounding the interface 5, so as to form a mini-environment around the interface 5, thus reinforcing the cleanliness of the gas injection.

In operation, the processing unit 40 is configured to process and use the measurement results of the particle counter 19 and to implement the measurement method 100.

FIG. 5 illustrates the different stages in the measurement method 100. The particle contamination measurement method 100 is preferably implemented before sending a transport pod to a liquid cleaning unit.

In a first stage 101, a jet of gas is perpendicularly directed towards a portion of wall 13 inside 10 a casing of a transport pod 3 coupled to a measurement station 1 so as to detach particles 11 from the casing 3 by means of the gas jet.

The injection of the gas jet can take place before or after the coupling of the casing 3 to the measurement station 1.

Simultaneously, the vacuum pump 17 is placed into operation such as to generate a gas outflow from the inside 10 of the casing of the transport pod 3 coupled to the measurement station 1 towards the particle counter 19.

The injection flow is higher than the pumping flow so as to create a leak flow towards the outside of the station.

The gas injection is pulsed, and/or a gas jet is successively injected into each of the injection nozzles 9, and/or the orientation and/or the position of the injection nozzle 9 are modified so as to sweep a portion of the wall 13, and/or a gas flow ramp is injected in the course of the first stage 101 of the measurement method 100 to obtain a discontinuous gas injection.

Thus, the particles 11 detached from the walls 13 are directed towards the inlet 23 of the measurement device 7 to be detected by the particle counter 19.

In the course of a second stage 102, a number of particles 11 is measured with the particle counter 19 and the result of the measurement is compared to a predefined threshold to determine whether a liquid cleansing stage is necessary based on the result of the comparison (stage 103) or whether the transport pod is sufficiently clean to remain in production and continue to transport or store substrates (stage 104).

It is also possible to perform a succession of measurements on the walls 13 so as to measure the particle contamination at different points.

For this purpose, in the course of the first stage 101, the gas jet is injected perpendicularly against the wall 13, for a relatively short period of time comprised between 5 and 30 seconds.

Then, in the course of the second stage 102, the injection is stopped, and the number of particles is measured. When the measurement is stabilized, or when the particle counter 19 no longer counts particles, the injection nozzle 9 is displaced perpendicularly to a new wall portion. The nozzle 9 is, e.g., axially displaced by a translation of the protruding pipe 32, so that the injection angle remains perpendicular to the same wall 13.

Then, the first and second stages 101, 102 are repeated in order to determine whether a liquid cleansing stage is necessary based on the result of the comparisons.

It is thus possible to estimate the contamination for several measurement points of the same wall 13 and for each wall. It is also possible to estimate the contamination for several measurement points of another wall by causing the extremity of the nozzle 9 to turn so that it will be directed perpendicularly towards a new wall 13 of the casing 3.

The measurement method 100 therefore enables a real time measurement of a level of particle contamination of transport pods by means of a succession of stages that may be implemented within an industrial manufacturing chain process.

Therefore, it is possible quickly to verify the particle cleanliness state of a transport pod. This prevents transport pods without particles being nonetheless cleaned, or else that others, which are particle polluted, continue to store and/or transport semiconductor substrates.

The invention claimed is:

1. A measurement station for measurement of particle contamination of a transport pod for conveyance and atmospheric storage of semiconductor substrates, the transport pod comprising a casing capable of being closed by a removable access door, the measurement station comprising:
    an interface capable of coupling to a casing of the transport pod instead of the removable access door, the interface comprising at least one injection nozzle arranged at one mobile end of a pipe protruding from the interface to direct a gas jet in a perpendicular direction towards a portion of a wall on an inside of the casing coupled to the measurement station, to detach particles from the casing by an impact of the gas jet on the wall, and
    a measurement device comprising a vacuum pump, a particle counter and a measurement conduit, of which an inlet leads to the inside of the casing and of which an outlet is connected to the vacuum pump, the measurement conduit being connected to the particle counter to create a communication between the inside of the casing of the transport pod coupled to the measurement station and the particle counter.

2. The measurement station of claim 1, wherein the interface is equipped with a plurality of spacers that enable the interface to couple with the casing while leaving interstitial gaps for a passage of a leak flow between the inside of the casing and the external environment.

3. The measurement station of claim 2, wherein the plurality of spacers have a shape of studs.

4. The measurement station of claim 1, further comprising an atmospheric chamber surrounding the interface.

5. The measurement station of claim 1, wherein the at least one injection nozzle is configured to inject a pulsed gas jet.

6. The measurement station of claim 1, wherein the interface comprises a plurality of injection nozzles equipped with particle filters.

7. The measurement station of claim 1, further comprising stoppers to plug filtered gas passages of the casing of the transport pod.

8. The measurement station of claim 1, further comprising a processing unit operable to generate a signal to a cleaning unit, the signal being representative of a state of cleanliness of the casing of the transport pod.

\* \* \* \* \*